(12) United States Patent
Amtmann et al.

(10) Patent No.: US 8,749,357 B2
(45) Date of Patent: Jun. 10, 2014

(54) METHOD OF DE-ACTIVATING AND ACTIVATING AN ELECTRONIC ARTICLE SURVEILLANCE (EAS) DEVICE, AND AN EAS DEVICE

(75) Inventors: Franz Amtmann, Graz (AT); Mario Steiner, Tobelbad (AT); Heinze Elzinga, Lassnitzhoehe (AT)

(73) Assignee: NXP B.V., Eindhoven (NL)

( * ) Notice: Subject to any disclaimer, the term of this patent is extended or adjusted under 35 U.S.C. 154(b) by 438 days.

(21) Appl. No.: 13/020,246

(22) Filed: Feb. 3, 2011

(65) Prior Publication Data
US 2011/0205030 A1    Aug. 25, 2011

(30) Foreign Application Priority Data

Feb. 3, 2010   (EP) ..................................... 10152520

(51) Int. Cl.
*H04Q 5/22*         (2006.01)
*G08B 1/08*         (2006.01)
*G08B 21/00*        (2006.01)
*G06K 15/00*        (2006.01)
*G06K 19/06*        (2006.01)

(52) U.S. Cl.
USPC ............... 340/10.5; 340/572.1; 340/539.26; 340/636.1; 340/10.1; 340/10.6; 235/383; 235/384; 235/492

(58) Field of Classification Search
CPC ............ G08B 13/242; G08B 13/2442; G08B 13/2457; G08B 13/2437; H01L 27/01; H01L 23/576; G01V 15/00; G06K 19/07381; G11C 13/0004; G11C 13/0011; G11C 13/0059

USPC ................. 340/10.1–10.6, 572, 572.1, 572.3, 340/572.5, 572.7, 539.26, 539.27, 636.1; 235/383, 384, 492; 361/321, 16

See application file for complete search history.

(56) References Cited

U.S. PATENT DOCUMENTS

| 4,686,516 A * | 8/1987 | Humphrey ................. 340/572.3 |
| 6,181,248 B1 * | 1/2001 | Fockens ...................... 340/572.3 |
| 6,752,837 B2 * | 6/2004 | Karp .......................... 340/572.1 |
| 7,109,867 B2 * | 9/2006 | Forster ....................... 340/572.3 |
| 7,187,289 B2 | 3/2007 | Eckstein et al. |

(Continued)

FOREIGN PATENT DOCUMENTS

| CN | 101099185 A | 1/2008 |
| EP | 1 429 301 A1 | 6/2004 |

(Continued)

OTHER PUBLICATIONS

Extended European Search Report for European Patent Application No. 10152520.2 (Jul. 20, 2010).

(Continued)

*Primary Examiner* — Daniel Wu
*Assistant Examiner* — Mancil Littlejohn

(57) ABSTRACT

A device for use in electronic article surveillance EAS is disclosed which comprises a resonant circuit, typically designed for 8.2 MHz operation, in addition to a transponder, such as RFID, for non-contact communication with a communication station. The RFID transponder can provide a signal to detune the resonant circuit to disable the EAS and optionally another signal to tune or retune the resonant circuit to enable or re-enable the EAS. The detuning and tuning or retuning may preferably be achieved using phase change memory material, configured as a programmable switch having two states with different resistances.

11 Claims, 3 Drawing Sheets

(56) References Cited

U.S. PATENT DOCUMENTS

| | | |
|---|---|---|
| 7,643,334 B1 | 1/2010 | Lee et al. |
| 2002/0130778 A1* | 9/2002 | Nicholson .................. 340/572.1 |
| 2004/0237081 A1 | 11/2004 | Homiller |
| 2009/0057642 A1* | 3/2009 | Sargent et al. .................... 257/4 |
| 2009/0262572 A1 | 10/2009 | Krusin-Elbaum et al. |
| 2010/0020594 A1 | 1/2010 | De Sandre et al. |

FOREIGN PATENT DOCUMENTS

| | | |
|---|---|---|
| JP | 2007-294638 A | 11/2007 |
| WO | 97/22085 A1 | 6/1997 |
| WO | 2006/075800 A1 | 7/2006 |
| WO | 2010/046252 A1 | 1/2010 |

OTHER PUBLICATIONS

Oh, G.-H. et al. "Parallel Multi-Confined (PMC) Cell Technology for High Density MLC PRAM", IEEE Symposium on VLSI Technology Digest of Technical Papers, pp. 220-221 (2009).

* cited by examiner

METHOD OF DE-ACTIVATING AND ACTIVATING AN ELECTRONIC ARTICLE SURVEILLANCE (EAS) DEVICE, AND AN EAS DEVICE

CROSS-REFERENCE TO RELATED APPLICATIONS

This application claims the priority under 35 U.S.C. §119 of European patent application no. 10152520.2, filed on Feb. 3, 2010, the contents of which are incorporated by reference herein.

FIELD OF THE INVENTION

This invention relates to electronic article surveillance devices. It further relates to methods of activating and de-activating electronic article surveillance devices.

BACKGROUND OF THE INVENTION

A widely-used type of electronic article surveillance (EAS) is based on RF technology, and utilises a resonance circuit operating in a dedicated part of the electromagnetic spectrum at around 8.2 MHz. If an active EAS label, hereinafter also referred to as a tag, is passed through a gate containing appropriate antennas, the resonance circuit modifies the magnetic field, and thus the presence of the EAS label can be detected.

Such technology is routinely used, for example wherein an EAS label is attached to an article for sale in a retail outlet. When the article is purchased at a Point-of-Sale (POS), the EAS label may be deactivated, which then allows the purchaser having the article to which the EAS label is still attached to pass through the gate, located near the exit to the retail outlet, without setting off an alarm. Any attempt by the purchaser to pass through the gate without the EAS label having been de-activated will result in the alarm being triggered, thereby warning the retailer of possible attempted theft of the article.

Transponders for non-contact communication with communication stations, also known as RFID, are also widely used in relation to retail articles. RFID labels are routinely attached to a wide range of retail products, and used for logistic purposes, such as item tracking and inventory control. However, compared with the main EAS frequency of 8.2 MHz, different frequency bands are allocated to RFID applications; these include 125 kHz, 13.56 MHz, 865 MHz (in Europe—the equivalent band being around 920 MHz in the United States) and 2.45 GHz.

The conventional method to deactivate an EAS label is to generate a high magnetic field which "burns" through a fuse within resonating circuit. The resonance circuit typically thus goes open circuit, and no longer is able to modify an electric field in a gate. Alternatively, and more frequently, it can make a short circuit by, for instance, burning the isolation such as dielectric between two capacitor plates. However, since the deactivation relies on a mechanical break in the resonance circuit, it may not be reliable, and the EAS label may become reactivated if the ends of the burnt fuse come into contact.

Furthermore, the de-activation is (at least intentionally) irreversible, in that once the EAS label has been deactivated, it is not possible to reactivate it, such that the EAS label is not reusable.

There is an ongoing requirement for an EAS label, which does not suffer, or suffers only to a reduced extent, from the above disadvantages.

SUMMARY OF THE INVENTION

It is an object of the present invention to provide an EAS which does not suffer from, or suffers only to a limited extent from, the above disadvantages.

According to a first aspect of the invention, there is provided a device for use in electronic article surveillance and comprising a transponder for non-contact communication with a communication station and a resonance circuit, wherein the resonance circuit is configured to exhibit either a first resonance characteristic or a second resonance characteristic, and the device is configured to change from a one of the first and second resonance characteristic to the other of the first and second resonance characteristics in response to a first signal from the transponder.

In embodiments, the resonance circuit includes an electrical switch which is capable of having a first resistance and a second resistance which is higher than the first resistance, and wherein the resonance circuit exhibits the first resonance characteristic when the switch has the first resistance and exhibits the second resonance characteristic when the switch has the second resistance.

Preferably, the electrical switch comprises phase change memory material which has a first, relatively crystalline, state, and a second, relatively amorphous, state, and the electrical switch exhibits the first resistance when the phase change memory material is in the first state and exhibits the second resistance when the phase change memory material is in the second state.

In embodiments, relative to the first resonance characteristic, the second resonance characteristic has at least one of a lower Q-factor and a different resonant frequency, such that use of the device electronic article surveillance is impaired.

In embodiments, the device is further configured to change from the other of the first and second resonant characteristic to the one of the first and second resonant characteristics in response to a second signal from the transponder.

In embodiments, each of the first and second signals comprises a current pulse through the electrical switch and having a respective rise time and a respective fall time, and the fall time of the current pulse of the second signal is short relative to that of the first signal.

In embodiments the fall time of the current pulse of the second signal is less than 10 ns. In embodiments, the fall time of the current pulse of the first signal is greater than 100 ns.

In embodiments, a peak of the current pulse of the second signal is greater than a peak of the current pulse of the first signal.

Preferably, at least one of the resonance is approximately 8.2 MHz and the transponder is operable at one of 125 kHz, 13.56 MHz, 865 MHz, 920 MHz and 2.45 GHz.

According to another aspect of the present invention, there is provided a method of activating or de-activating a device for use in electronic article surveillance and having a resonance circuit and a transponder for non-contract communication with a communication station, the method comprising, in response to an instruction from the communication station, the transponder supplying a respective activation signal or deactivation signal to the resonance circuit, and the resonance circuit respectively tuning or de-tuning in response to the signal.

In embodiments, the respectively tuning or de-tuning comprises changing the resistance of a phase change memory material which comprises at least a part of the resonance circuit.

In embodiments, supplying a respective activation or deactivation signal comprises supplying a first current pulse to the phase change memory material, which first current pulse has a sufficiently high peak and a sufficiently long fall-time to allow recrystallization of the phase change memory material.

In embodiments, supplying a respective activation or deactivation signal comprises supplying a second current pulse to the phase change memory material, which second current pulse has a sufficiently high peak to locally melt the phase change memory material and a sufficiently short fall-time to inhibit recrystallization of the phase change memory material.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
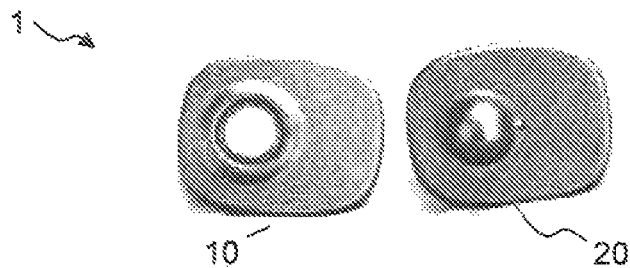
FIG. 1 shows a conventional EAS label.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

FIG. 1 shows an example of a conventional EAS tag, prior to being an attached to a retail article. The tag 1 comprises two halves 10 and 20. The tag is arranged to be attached to a retail article, for instance by clipping the two halves 10 and 20 together through the fabric of an article of clothing. The tag should not be easily removable by a purchaser of the retail article. At the Point-of-Sale POS), the tag may either be unclipped by the retailer using a dedicated tool for the purpose, or may be deactivated.

Figure 2:
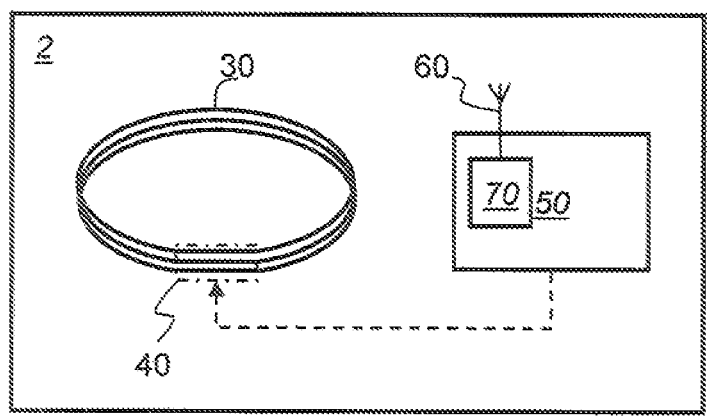
FIG. 2 shows in schematic form, an EAS label according to an embodiment of the present invention.

A schematic configuration of an EAS tag according to an embodiment of the invention is shown in FIG. 2. The device 2 comprises an EAS label having a resonance circuit 3. In a conventional EAS tag the resonance circuit may include a fuse (not shown), which may be blown by the application of a high magnetic field, in order to deactivates the tag; in contrast, the resonance circuit 30 shown in FIG. 2 has a programmable switch 40. The programmable switch 40 is under the control of a transponder 50, which is an RFID device as will be familiar to the person skilled in the art. The RFID device includes an antenna 60 which is connected to an integrated circuit (IC) 70. In the case of a passive RFID device the power required to operate the IC 70 may be scavenged from the electromagnetic field experienced by the aerial or antenna 60, which may be in the form of a coil. Alternatively, a further antenna may be used for the scavenging, or a combined antenna used. For UHF frequencies (such as 865 MHz or 2.45 GHz), a dipole or folded dipole may typically be used. The RFID device 50 may take one of several known forms, which will be familiar to the person skilled in the art.

The programmable switch 40 may take one of several forms; significant is its ability to be latched in either of two states. In less preferred embodiments, the programmable switch 40 may take the form of an erasable electrically programmable read-only memory (EEPROM); however, this form of programmable switch is less preferred since it requires a large area (also referred to as real estate) of semiconductor to implement, and requires relatively expensive processing; moreover, it is relatively power hungry, at least during programming.

Figure 3:
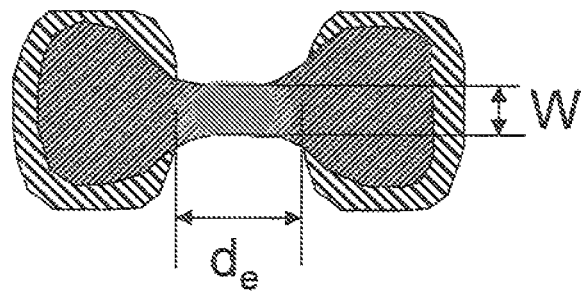
FIG. 3 shows an example of a programmable switch comprising phase change memory material.
Figure 5:
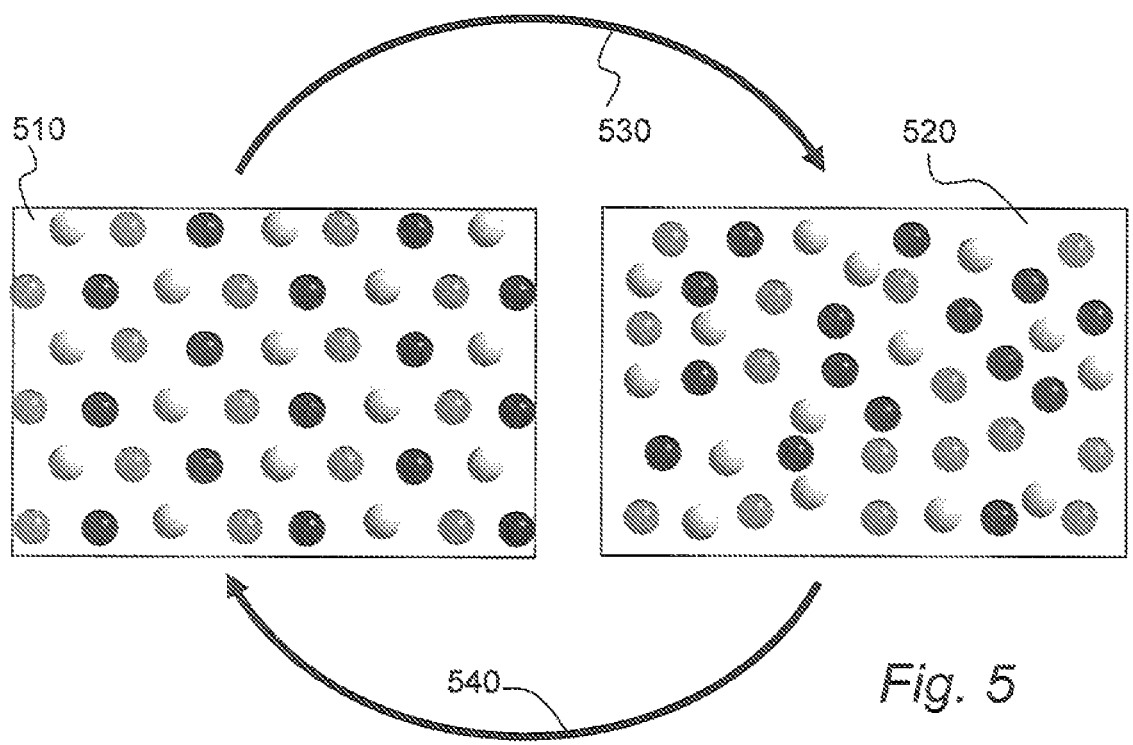
FIG. 5 shows schematically the phase change memory material in an amorphous state and a crystalline state.

In a preferred embodiment, the programmable switch 40 comprises a resistor made of phase change memory material, as is illustrated in FIG. 3. A phase change memory material (PCM) is one which can exhibit two or more phases, and in which the particular phase which it exhibits, is dependent on the processing history of the material. A phase change memory material having two phases is shown schematically in FIG. 5. In a first phase, shown at 510, the material is in a crystalline state in which the atoms are well ordered; in the other state, shown at 520, the material is in an amorphous form, in which the individual atoms are not well ordered, but are randomly or pseudo-randomly arranged. It is possible to change from the crystalline phase 510 to the amorphous phase 520 by a appropriate processing of the material, as shown by arrow 530; conversely, it is possible to change from the amorphous form 520 to the crystalline form 510 by a different processing of the material, shown by arrow 540.

It may also be possible for most but not all of the material to be in the crystalline phase, whilst a remnant of material is in the amorphous phase, and vice versa.

Figure 4A:
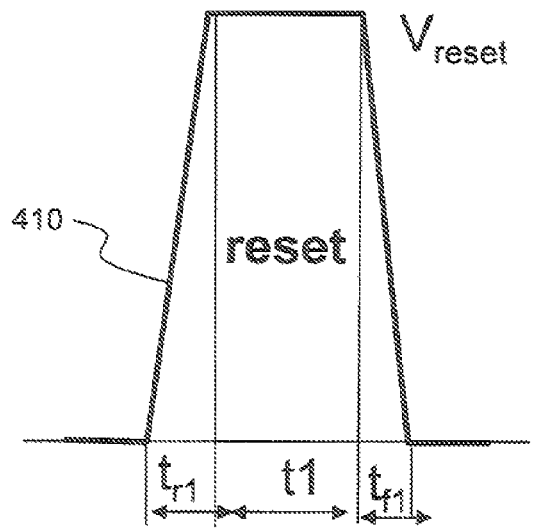
FIG. 4 shows, at FIG. 4a a reset pulse, and at FIG. 4b a set pulse, such as can be used to programme the phase change memory material.
Figure 4B:
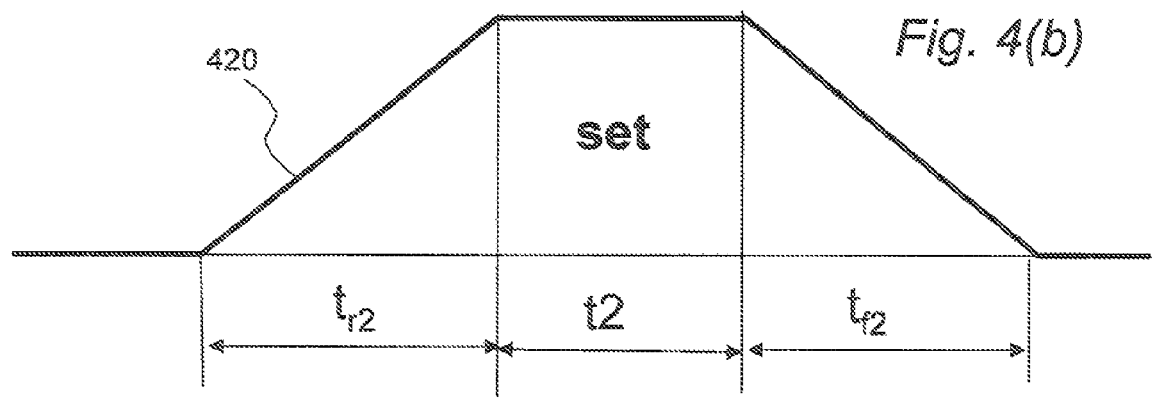

Examples of the processes which can change the phase of the material are shown in FIG. 4; that corresponding to changing from crystalline phase 510 to amorphous phase 520 (corresponding to arrow 530) is shown in FIG. 4(a), and that for changing the material from an amorphous phase 520 to a crystalline phase 510 (corresponding to arrow 540) is shown in FIG. 4(b).

FIG. 4(a) shows a current pulse 410, which is passed through the PCM material. The current quickly rises, during rise time $t_{r1}$, to a relatively high value, and remains at this high value during the period t1. The current is then quickly extinguished over a short fall time $t_{f1}$. Due to the Joule heating effect of this current, the temperature of the PCM material rapidly rises to the point to where the material locally melts; when the current is switched off, the material is rapidly quenched. As a result of the quenching, there is not time for the atoms within the material to recrystallize to an ordered structure; rather, the material takes up an amorphous phase. The material remains in this amorphous phase, in the absence of any further, different, control process. That is to say, application of another pulse 410 of the form shown in FIG. 4(a) leaves the material still in the amorphous phase. In order for the quenching to be effective, the fall-time, $t_{f1}$, must be relatively short, and can typically 10 ns or less. Furthermore, since the quenching requires a rapid change in temperature, it is required that the thermal conductivity of the material be adequate to dissipate heat from the active part of the phase change material. The phase change material may thus typically take the geometrical form of a dumbbell, as shown in FIG. 3, where a width W of material along a track length $d_e$ is designed to change phase, and electrical contacts made to the PCM material from the remainder of the resonance circuit at each of the two bell ends of the dumbbell.

FIG. 4(b) shows a current pulse 420 which is suitable for changing the PCM material from an amorphous phase 520 to the crystalline phase 510 (the change corresponding to arrow 540). This current pulse rises over a rise-time $t_{r2}$ period to a current level which may be insufficient to melt the material, but allows a high level of solid-phase diffusion within it; after remaining at this current level for a period t2, the current is reduced over a relatively long fall time $t_{f1}$. Due to the relatively long duration of the fall-time, there is sufficient time for the atoms to arrange themselves into an energetically favourable ordered crystalline lattice 510. In order to provide sufficient time at sufficient high temperature for recrystallization to occur, the fall-time may be 100 ns or more, or many hundreds of nanoseconds, or even several milliseconds. One limitation to the length of the fall-time, in the case of a passive transponder, is the amount of energy available to the transponder.

The material remains in this crystalline phase, in the absence of any further current pulse involving a rapid quenching from the molten phase. That is to say, application of another pulse 420 of the form shown in FIG. 4(b) leaves the material still in the crystalline phase.

As will be immediately appreciated by the skilled person, in common with other materials, PCM materials in the crystalline phase typically exhibit a significantly lower electrical resistance than they do in the amorphous phase.

By a suitable configuration of the resonance circuit 30, the resonance circuit of an EAS label according to an embodiment of the invention, may be arranged to have two differing resonance characteristics, depending on the state of the PCM material. In particular, according to an embodiment of the invention, the circuit may be arranged to have a high quality factor (Q-factor), that is to say a sharply peaked, resonance at 8.2 MHz, when the PCM material exhibits a low resistance corresponding to a first state of the PCM material, wherein a relatively high proportion of the material is in a crystalline phase; conversely, when a relatively high proportion of the material is in an amorphous phase, it exhibits a higher a letter resistance, and the circuit may be configured to have a much lower Q factor resonance at 8.2 MHz. According to another embodiment of the invention, the resonant frequency may be arranged to be closed matched to 8.2 MHz when the PCM material is in the first state having a relatively high proportion in a crystalline phase, and to be further away from 8.2 MHz, when the PCM material is in the second state having a relatively high proportion in an amorphous phase. Alternatively, the EAS label may be configured such that at least one of the Q-factor of the resonance is higher, or the resonance is better centred at 8.2 MHz, when the PCM material is in the second state, having a relatively high proportion of amorphous phase material.

Figure 6:
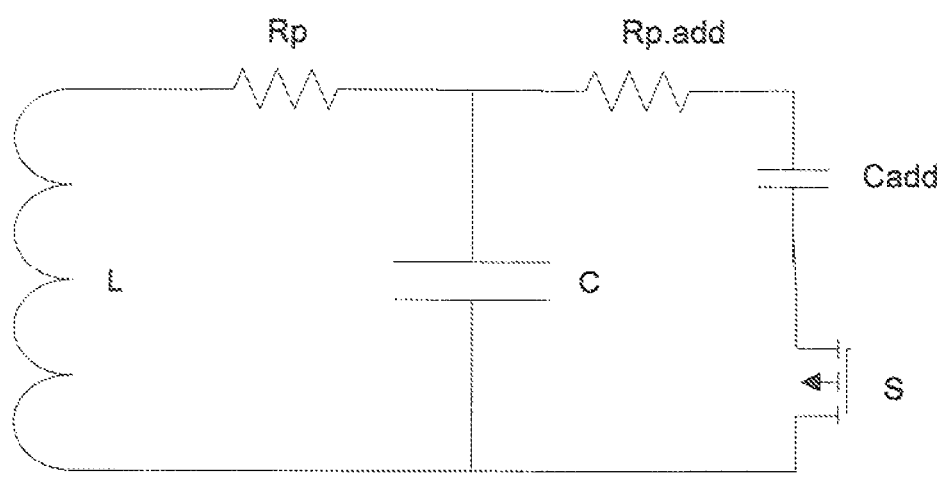
FIG. 6 shows a resonance circuit according to an embodiment of the invention.

In another embodiment, depicted in FIG. 6, the resonance circuit has a main resonant loop comprising capacitance C and inductance L, and having parasitic resistance Rp; the PCM material is arranged in a subsidiary arm of the resonance circuit, in series with additional capacitance Cadd, The PCM material acts as a switch, such that in a first state (in this example, that corresponds to the PCM being in a amorphous or relatively amorphous phase) the switch is open (having a high resistance), and in a second state, the switch is closed, and the subsidiary arm has an additional parasitic resistance Rp.add, comprising the resistance of the switch when closed (the PCM being in a second state, corresponding to a crystalline, or predominantly crystalline, phase). When the switch is closed, the presence of the additional capacitance Cadd and the additional parasitic resistance Rp.add, detunes the responsance circuit.

In a preferred embodiment of the invention, the RFID label sends a deactivation signal on receipt of an instruction from an RFID reader and controller (not shown) to the resonance circuit. The RFID reader and controller may be for instance positioned at the POS in a retail outlet, and may for instance be used to control the retail transaction such as identifying the type of article to an automated checkout system. Any requirement for a separate or additional action by the retailer, to deactivate the EAS, may thereby be avoided. The deactivation signal may either be the "reset" current pulse starting from a predominantly amorphous phase depicted in FIG. 4(a) or the "set" current pulse starting from a predominantly crystalline phase as shown in FIG. 4(b), depending on the particular configuration of the resonance circuit.

The current required by the transponder for deactivation signal may typically be scavenged from the RF field (in the case of a passive transponder) or may be stored separately for instance in a battery.

In contrast to conventional EAS labels, which comprise a fuse which may be blown, the EAS label according to embodiments of the invention may be reactivated. This may be required or desired for instance where an article has been returned to the retailer for resale. Reactivation is effected by the transponder providing an activation signal to the resonance circuit. Depending on the configuration of the resonance circuit, the activation signal may be a current pulse corresponding either to that shown in FIG. 4(a), or to that shown in FIG. 4(b).

Beneficially, since the PCM material "latches" into either of the phases, the EAS label remains in its respective activated or deactivated state, irrespective of whether the transponder is operational or powered.

In summary, then, from one viewpoint a device for use in electronic article surveillance EAS is disclosed above which comprises a resonant circuit, typically designed for 8.2 MHz operation, in addition to a transponder, such as RFID, for non-contact communication with a communication station. The RFID transponder can provide a signal to detune the resonant circuit to disable the EAS and optionally another signal to tune or retune the resonant circuit to enable or re-enable the EAS. The detuning and tuning or retuning may preferably be achieved using phase change memory material, configured as a programmable switch having two states with different resistances.

From reading the present disclosure, other variations and modifications will be apparent to the skilled person. Such variations and modifications may involve equivalent and other features which are already known in the art of EAS, and which may be used instead of, or in addition to, features already described herein.

In particular, although the fall of the current pulse to recrystallize the material is shown in FIG. 4 as being linear, it may be non-linear, for instance is may include one or more steps, in order to better control the crystallization.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A device for use in electronic article surveillance and comprising a transponder for non-contact communication with a communication station and a resonance circuit, the resonance circuit including an electrical switch which is capable of having a first resistance and a second resistance which is higher than the first resistance, the electrical switch comprising phase change memory material which has a first, relatively crystalline state, and a second, relatively amorphous state, wherein the phase change memory material is changed from the first state to the second state by passing a current pulse, the current pulse having a peak value, succeeded by switching off the current such that the current takes less than 10 nano-seconds to fall from the peak value to a substantially zero value, wherein the resonance circuit exhibits a first resonance characteristic when the switch has the first resistance and exhibits a second resonance characteristic when the switch has the second resistance, and wherein the electrical switch exhibits the first resistance when the phase change memory material is in the first state and exhibits the second resistance when the phase change memory material is in the second state, wherein the device does not include a separate memory element for storing activated or deactivated states of the device.

2. A device as claimed in claim 1, wherein relative to the first resonance characteristic, the second resonance characteristic has at least one of a lower Q-factor and a different resonant frequency, such that use of the device electronic article surveillance is impaired.

3. A device as claimed in claim 1 further configured to change from the other of the first and second resonant characteristic to the one of the first and second resonant characteristics in response to a second signal from the transponder.

4. A device as claimed in claim 3, wherein each of the first and second signals comprises a current pulse through the electrical switch and having a respective rise time and a respective fall time, and the fall time of the current pulse of the second signal is short relative to that of the first signal.

5. A device as claimed in claim 4, wherein the fall time of the current pulse of the second signal is less than 10 ns.

6. A device as claimed in claim 4, wherein the fall time of the current pulse of the first signal is greater than 100 ns.

7. A device as claimed in claim 4, wherein a peak of the current pulse of the second signal is greater than a peak of the current pulse of the first signal.

8. A device as claimed in claim 1, wherein at least one of the resonance characteristics is approximately 8.2 MHz and the transponder is operable at one of 125 kHz, 13.56 MHz, 865 MHz, 920 MHz and 2.4 GHz.

9. A method of activating or de-activating a device for use in electronic article surveillance and having a resonance circuit and a transponder for non-contract communication with a communication station, the method comprising, in response to an instruction from the communication station, the transponder supplying a respective activation signal or deactivation signal to the resonance circuit, and the resonance circuit respectively tuning or de-tuning in response to the signal wherein the respectively tuning or detuning comprises changing the resistance of a phase change memory material which comprises at least a part of the resonance circuit wherein the resistance of the phase change memory material is changed by passing a current pulse, the current pulse having a peak value, succeeded by switching off the current such that the current takes less than 10 nano-seconds to fall from the peak value to a substantially zero value, wherein the device does not include a separate memory element for storing activated or deactivated states of the device.

10. The method of claim 9 wherein supplying a respective activation or deactivation signal comprises supplying a first current pulse to the phase change memory material, which first current pulse has a sufficiently high peak and a sufficiently long fall-time to allow recrystallization of the phase change memory material.

11. The method of claim 9 wherein supplying a respective activation or deactivation signal comprises supplying a second current pulse to the phase change memory material, which second current pulse has a sufficiently high peak to locally melt the phase change memory material and a sufficiently short fall-time to inhibit recrystallization of the phase change memory material.

* * * * *